US006291846B1

(12) United States Patent
Ema et al.

(10) Patent No.: US 6,291,846 B1
(45) Date of Patent: *Sep. 18, 2001

(54) DRAM SEMICONDUCTOR DEVICE INCLUDING OBLIQUE AREA IN ACTIVE REGIONS AND ITS MANUFACTURE

(75) Inventors: Taiji Ema; Satoru Saitoh; Tamon Shinmoto; Koichi Masuda, all of Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,510

(22) Filed: Jun. 19, 1997

(30) Foreign Application Priority Data

Jun. 19, 1996 (JP) .................................... 8-158494

(51) Int. Cl.$^7$ ...................... H01L 27/108; H01L 29/76; H01L 29/94; H01L 31/119
(52) U.S. Cl. ...................... 257/296; 257/206; 257/303; 257/306
(58) Field of Search ...................... 257/296, 401, 257/303, 306, 905, 907, 206; 438/253, 254, 396

(56) References Cited

U.S. PATENT DOCUMENTS

| 4,970,564 | * 11/1990 | Kimura et al. | 257/401 |
| 5,014,103 | 5/1991 | Ema | 357/41 |
| 5,365,095 | * 11/1994 | Shono et al. | 257/296 |
| 5,457,064 | * 10/1995 | Lee | 438/253 |
| 5,732,009 | * 3/1998 | Tadaki et al. | 257/296 |

* cited by examiner

Primary Examiner—Sara Crane
Assistant Examiner—Thien F. Tran
(74) Attorney, Agent, or Firm—Armstrong, Westerman, Hattori, McLeland & Naughton, LLP

(57) ABSTRACT

A DRAM semiconductor device is provided which includes a semiconductor substrate, a field insulating film formed on the semiconductor substrate, a plurality of active regions in the semiconductor substrate, each surrounded by the field insulating film, a gate electrode traversing each of the plurality of active regions, a pair of source/drain regions formed in each of the plurality of active regions on both sides of the gate electrode, a plurality of bit lines extending along one direction, each connected to one of the pair of source/drain regions, a plurality of word lines extending along a direction perpendicular to the bit lines, each of the plurality of word lines being connected to the gate electrode, and a plurality of capacitor elements extending over said gate electrode each connected to the other of the pair of source/drain regions, wherein each of the plurality of active regions includes an oblique area formed obliquely relative to the bit and word lines and a parallel area formed in parallel to the bit line and having a width greater than the width of the oblique area, and each of the word lines has a bent portion intersecting substantially at a right angle with the oblique area of each of the active regions.

29 Claims, 11 Drawing Sheets

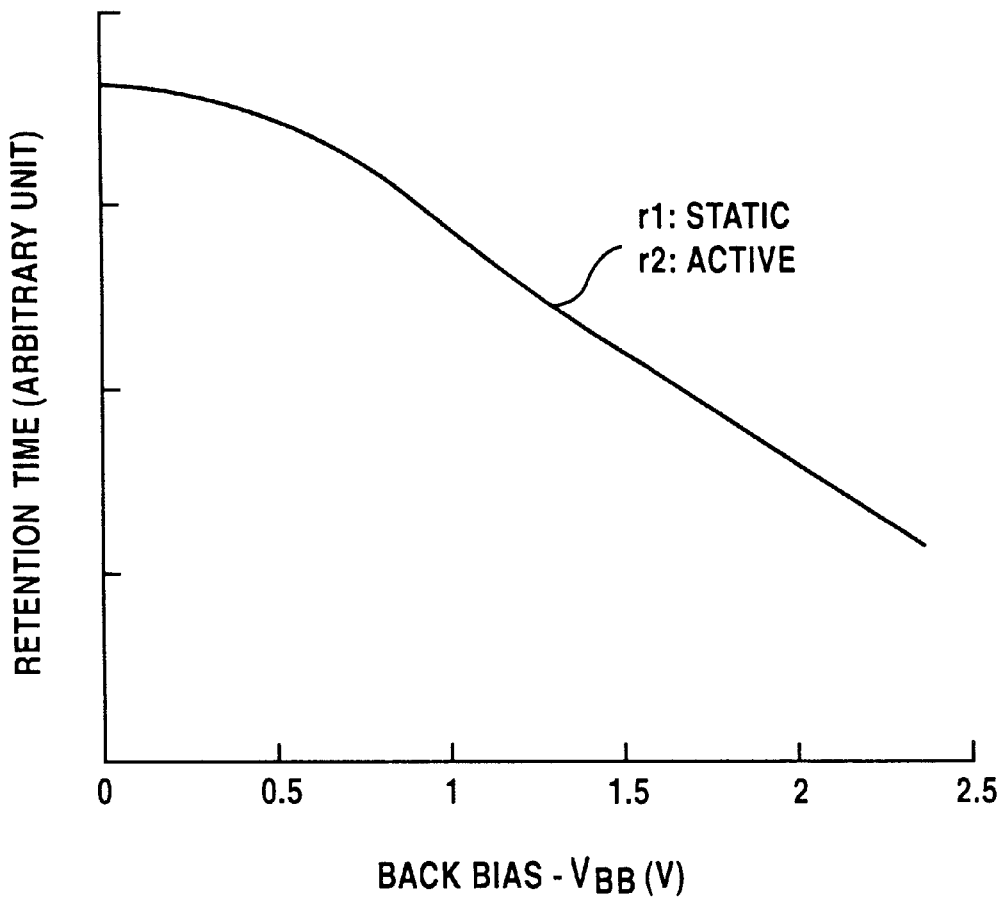

FX  S  BX

WL   WL

DRAM SEMICONDUCTOR DEVICE INCLUDING OBLIQUE AREA IN ACTIVE REGIONS AND ITS MANUFACTURE

BACKGROUND OF THE INVENTION a) Field of the Invention

The present invention relates to a semiconductor device and its manufacture, and more particularly to a dynamic random access memory (DRAM) semiconductor device and its manufacture.

In this specification, a DRAM semiconductor device means a semiconductor device having a DRAM portion, and also includes those having other functional elements.

b) Description of the Related Art

One DRAM cell is generally made of one memory capacitor and one transistor. This transistor is generally an insulating gate (IG) field effect transistor (FET), and typically a metal-oxide-semiconductor (MOS) FET, which is constituted of a pair of source/drain regions, a channel coupling the source/drain regions, and an insulated gate electrode disposed over the channel for controlling the conductivity of the channel.

A memory capacitor is connected to one of the pair of source/drain regions (which is called a source for convenience sake), and a bit line is connected to the other (which is called a drain for convenience sake). A word line is connected to the insulated gate electrode.

For the implementation of a number of memory cells in a limited rectangular area and for the effective read/write of information, it is preferable to dispose bit and word lines orthogonally. Each memory cell is connected to each cross point between bit and word lines.

If one drain region is shared by two transistors and connected to a bit line, an area occupied per one transistor can be reduced. In this case, integrated or merged two transistors are formed in one active region, and the bit line is connected to the central drain region. In order to connect memory capacitors to two sources at opposite end portions of the active region, it is preferable to dispose the active region obliquely relative to the bit lines. Then, word lines become also oblique relative to active regions.

One of the present inventors, Ema, has proposed a DRAM semiconductor device in which the layout of an active region and word lines of each memory cell is devised to stabilize the threshold values of transistors even under misalignment of patterning (Japanese Patent Laid-open Publication HEI-2-192162 and U.S. Pat. No. 5,014.013 issued on May 7, 1991, which are incorporated herein by reference).

FIG. 5 shows the layout of memory cells proposed by Ema. A plurality of bit lines BL extend straight and in parallel in the horizontal direction in FIG. 5. Bit lines disposed straight can minimize their resistance values. Each active region AR is disposed obliquely (about 30 degrees) relative to bit lines BL.

In an area where the active region AR crosses the bit line BL, a contact portion BL' of the bit line is formed which is wider than the other portion of the bit line. A bit line contact hole BH is formed through an interlayer insulating film disposed between the active region AR and bit line BL. A capacitor contact hole SH is disposed generally at the center of an area surrounded by two adjacent bit lines BL and two adjacent word lines WL. Namely, the distance from the capacitor hole to nearest bit/word lines is maximized.

A storage electrode SE of the capacitor is disposed around the capacitor contact hole SE in an area between upper and lower bit lines BL, the electrode covering the adjacent word line.

In the area between the bit line contact hole BH and capacitor contact hole SH, the active region AR extends straight at a constant width. The active region AR includes a region AR' to reserve an area under the capacitor contact hole, this region AR' having a shape symmetrically folded relative to a virtual vertical line passing through the center of the capacitor contact hole SH.

A word line WL extends as a whole in a vertical direction of FIG. 5. However, this word line is curved around the center of the contact hole of the bit line BL In an area crossing the bit line, connected to the corresponding active region AR. The word line WL can therefore be disposed generally at a right angle relative to the active region AR. With this layout, even if there is any position alignment error between the word line WL and active region AR, the threshold value of each transistor can be maintained constant.

SUMMARY OF THE INVENTION

An object of the invention is to improve the above-described proposal made by one of the present inventors.

Another object of the invention is to provide a DRAM semiconductor device having stable and excellent characteristics.

According to one aspect of the present invention, there is provided a DRAM semiconductor device comprising: a semiconductor substrate; a field insulating film formed on the semiconductor substrate; a plurality of active regions each surrounded by the field insulating film and formed in the semiconductor substrate; a gate electrode traversing each of the plurality of active regions; a pair of source/drain regions, formed in each of the plurality of active regions on both sides of the gate electrode; a plurality of bit lines disposed along one direction each connected to one of the pair of source/drain regions; a plurality of word lines disposed along a direction perpendicular to the bit lines, each of the plurality of word lines being connected to the gate electrode; and a plurality of capacitor elements disposed over the gate electrode each connected to the other of the pair of source/drain regions, wherein each of the plurality of active regions includes an oblique area formed obliquely relative to the bit and word lines and a parallel area formed in parallel to the bit line and having a width greater than the width of the oblique area, and the word lines have a bent portion intersecting at substantially a right angle with the oblique area of the active region.

According to another aspect of the invention, there is provided a DRAM semiconductor device comprising: a semiconductor substrate; a plurality of parallel bit lines disposed over the semiconductor substrate and linearly extending along one direction; a plurality of active regions formed on the surface of the semiconductor substrate, each of the active regions including a linear stripe area whose central area intersects with the bit line at a first angle and opposite end areas continuous with the opposite ends of the stripe area in a longitudinal direction thereof each having a width greater than a width of the stripe area; a field insulating film formed on the semiconductor substrate and having openings which define the plurality of active regions; a bird's beak insulating film formed on the surface of the active region of the semiconductor substrate along an inner circumference of the opening of the field insulating film and defining an intrinsic active region at an inner area of the bird's beak insulating film and defining a quasi-active region under the bird's beak insulating film; a plurality of word lines formed over the semiconductor substrate and intersecting as a whole at substantially a right angle with the bit lines, two of the word lines being associated with each active region, and each of the plurality of word lines having a bent portion intersecting at substantially a right angle with the stripe area over an associated one of the active regions and having substantially no overlap with a non-associated one of the active regions; one drain and a pair of sources formed in each of the intrinsic active regions, the one drain being formed between associated two of the word lines, and the pair of sources being formed outside of the associated two of the word lines; and a storage capacitor connected to each of the sources.

According to yet another aspect of the present invention, there is provided a method of manufacturing a DRAM semiconductor device comprising the steps of: forming a field insulating film on a semiconductor surface, the field insulating film surrounding active regions, each including an oblique area oblique to one reference direction and a parallel area parallel to the one reference direction having a width greater than a width of the oblique area; forming a gate insulating film on each the active region, depositing a conductive film on the whole upper surface of the semiconductor substrate, and patterning the conductive film to form word lines, the word lines having a bent portion intersecting at a right angle with the oblique area of the active region and extending as a whole along a direction perpendicular to the one reference direction; implanting impurities into each the active region to form source/drain regions by using the word lines and the field insulating film as a mask; forming a plurality of bit lines connected to ones of the source/drain regions and extending along the one reference direction; and forming a capacitor element connected to the others of the source/drain regions.

A devised shape of an oxidation-resistant mask for defining an active region, i.e, a devised shape of the active region, made it possible to greatly suppress the growth of bird's beaks.

Devised shapes of the active region and the bird's beak made it possible to considerably improve the retention characteristics of a DRAM semiconductor device.

As appreciated from the foregoing description, variation of the threshold characteristics of memory cell transistors can be suppressed. Leak current to be caused by interference by the adjacent word line can also be suppressed. A contact area of a storage electrode can be reserved sufficiently.

BRIEF DESCRIPTION OF THE DRAWINGS

FIG. 4 is a graph showing the retention characteristics of samples of the DRAM semiconductor device according to the embodiment.

DETAILED DESCRIPTION OF THE PREFERRED EMBODIMENTS

Prior to the description of embodiments of the invention, some problems found in DRAM semiconductor devices proposed by one of the inventors and the analysis thereof will be described.

Figure 5:
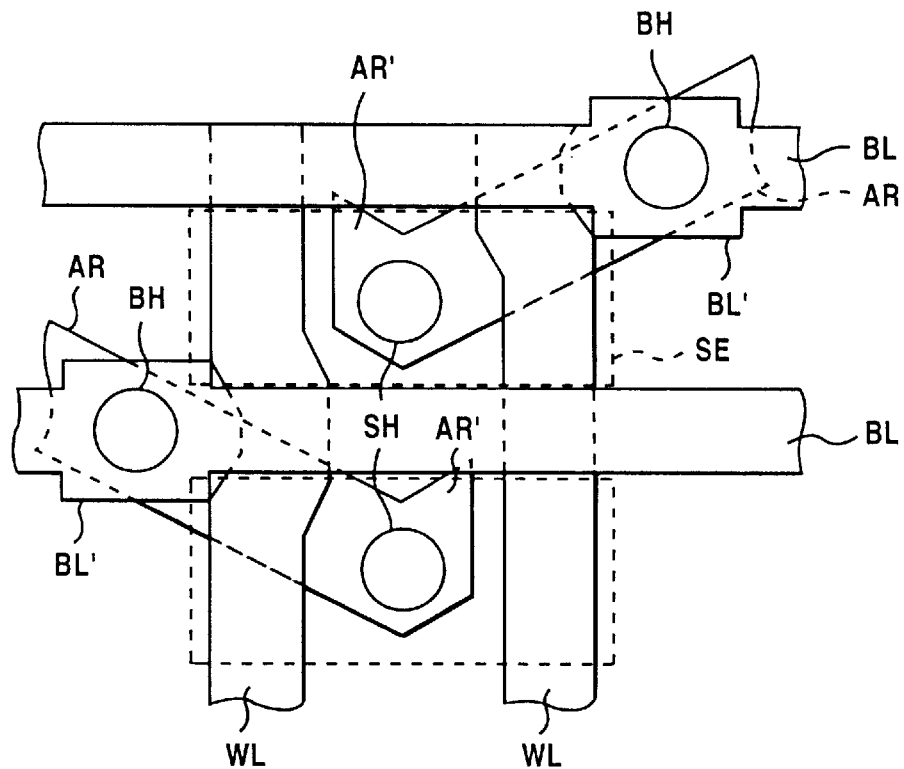
FIG. 5 is a plan view showing a layout of a DRAM semiconductor device according to a prior art.

When the DRAM semiconductor device shown in FIG. 5 was actually manufactured, it was found that the device had insufficient contact characteristics of storage capacitors. Reasons of this problem were investigated and it was found that a bird's beak extended from the end portion of the folded active region AR' deep into the contact area of the storage capacitor. The width of a bird's beak insulating film extending from the end portion thereof was very great. One countermeasure of mitigating the effects of a bird's beak upon the folded active region AR' was considered to elongate this folded portion AR'.

Figure 6:
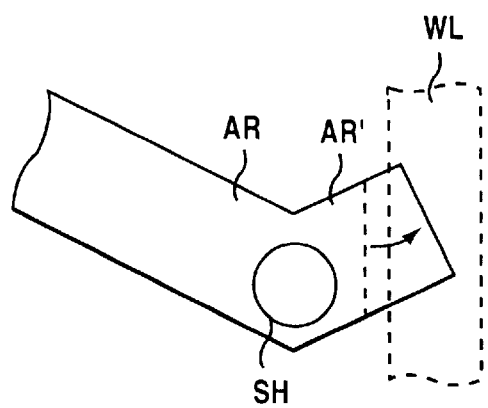
FIG. 6 is a plan view showing the structure of a comparison example used for the studies by the present inventors.

When the folded portion AR' is elongated as shown in FIG. 6, its distal end inevitably crawls under the word line WL. However, in this case, a bird's beak insulating film extends from the end of the folded portion AR' to such an extent that the active region surrounded by this bird's beak insulating film is in the area outside of the word line WL. Therefore, the storage capacitor can attain a sufficient contact area irrespective of the presence of a bird's beak.

Samples having elongated folded active regions AR' as shown in FIG. 6 were prepared and the characteristics thereof were studied.

A buffer oxide film was formed on a silicon substrate, and a silicon nitride film was deposited on the buffer oxide film. A resist film was coated on the silicon nitride film, and exposed by using a mask having a pattern of the active region AR shown in FIG. 6. Since the size of the pattern is very small, corners of the pattern are considered to be rounded by interference of exposure light. After the exposure, the resist film was developed to form a resist mask. The silicon nitride film under the resist mask was selectively etched to form an oxidation-resistant mask.

The semiconductor substrate was heated in an oxidizing atmosphere to perform local-oxidation-of-silicon (LOCOS) and grow a field insulating film. Thereafter, the surface of the substrate was cleaned with HF to lightly remove the oxide film, the oxidation-resistant mask of silicon nitride was removed with hot phosphoric acid, and the buffer oxide film was also removed.

Figure 7A:
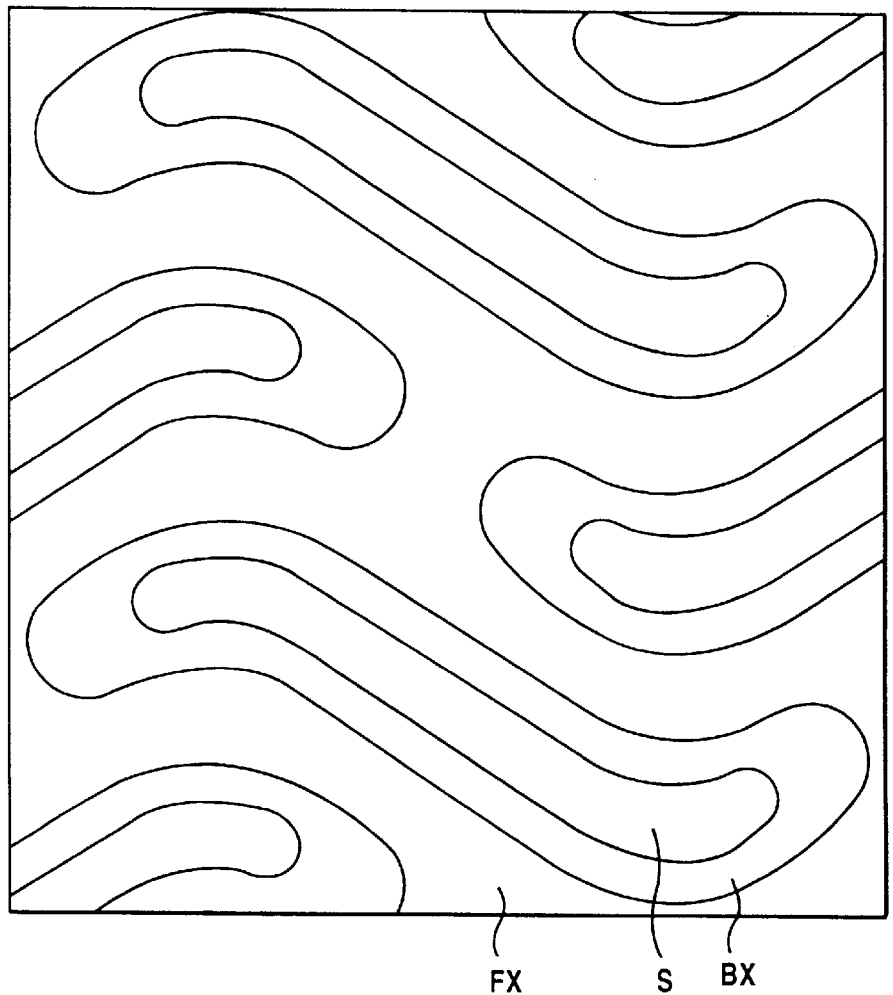
FIG. 7A to 7C are sketch and cross sectional views showing the shape of the active regions of the comparison example.

FIG. 7A is a sketch of a microscopic photograph showing the substrate surface having a field oxide film formed in the above manner. A continuous field oxide film FX has a number of openings corresponding to the oxidation-resistant mask. Each opening has therein an exposed silicon surface S surrounded by a bird's beak oxide film BX. A region with the exposed silicon surface S constitutes an intrinsic active region which the bird's beak oxide film BX surrounds. A total area of the intrinsic active region S and bird's beak oxide film BX constitutes the active region AR.

It is to be noted that the width of the bird's beak oxide film BX crawling from opposite ends of the active region is very large as about 0.47 μm. In a central stripe area of the active region, the width of the bird's beak oxide film BX crawling from opposite sides is about 0.08 μm. A wider size of the bird's beak oxide film BX crawling from the opposite ends of the active region in its longitudinal direction may be ascribed to the elongated shape of the active region.

Figure 7B:
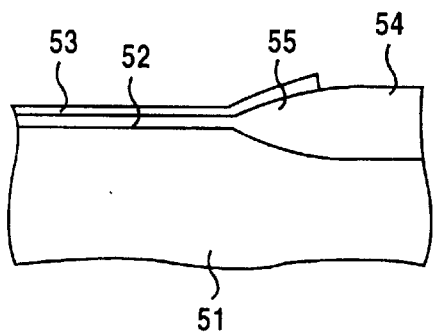

FIG. 7B is a schematic diagram showing the cross section of a substrate after LOCOS. Through a buffer oxide film 52 formed on the surface of a silicon substrate 51, a silicon nitride film 53 is formed. The shape of the silicon nitride film 53 corresponds to that of the active region. As the silicon substrate 51 is maintained in an oxidizing atmosphere of high temperature, oxidation progresses at the area where the silicon nitride pattern 53 is not formed. Although the silicon nitride film 53 intercepts oxidizing species such as oxygen, the underlying buffer oxide film 52 permits passage of oxidizing species. As a result, oxidizing species gradually crawl from the end of the silicon nitride film 53, and as the field oxide film 54 grows, a bird's beak oxide film 55 grows at the periphery of the field oxide film 54.

Figure 7C:
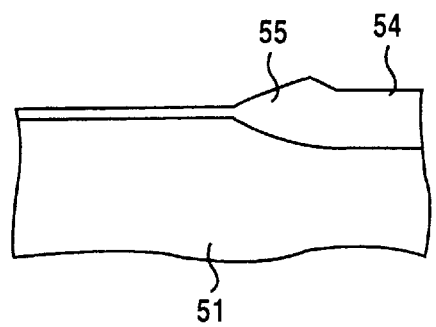

As shown in FIG. 7C, after the oxidation process, the surface of the substrate is lightly etched with HF to remove a thin oxide film formed on the surface of the silicon nitride film 53, and thereafter the silicon nitride film is removed with hot phosphoric acid.

The field oxide film 54 is lightly etched by the initial HF process so that the height of the film 54 reduces lower than the maximum height of the bird's beak oxide film 55. Therefore, the bird's beak oxide film 55 has a shape having a so-called bird's head. A stripe at the outer periphery of each active region shown in FIG. 7A corresponds to the slanted surface of this bird's head. On the semiconductor substrate underwent the above-described LOCOS oxidation, DRAM memory cells were formed.

The performance of DRAM semiconductor devices formed in the above manner was tested and it was found that the retention characteristics of memories were insufficient. For the inspection of memory retention characteristics, static and active retention times were measured. For the measurement of static retention time, after each memory cell is written with predetermined information, all word lines are maintained to be turned off. The written information is read thereafter at respective timings, e.g., at a time after 300 msec, to judge whether the memory information is correct or not. The retention of a memory bit having the worst performance is measured.

For the measurement of the active refresh characteristics, after information is written in a specific storage capacitor, nearby word lines are repetitively applied with on/off signals. The retention characteristics, etc. of the memory written with the information are checked thereafter at respective timings, for example after 300 msec.

As the experiment conditions, information "0" was written into a memory at a write voltage of 0 V, information "1" was written at a write voltage of 4 V, and each word line was turned off at 0 V and on at 6 V. The back-bias of the substrate was changed in the range from 0 V to -2.5 V.

Figure 8:
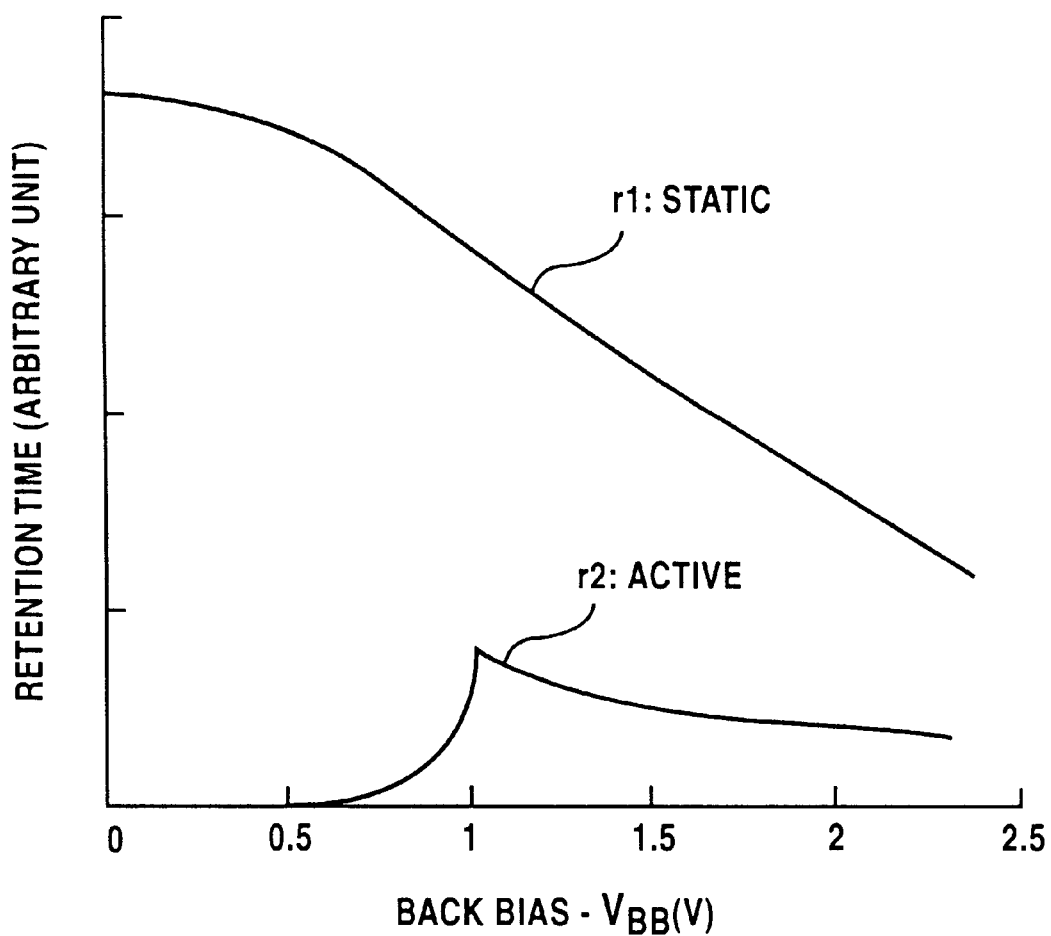
FIG. 8 is a graph showing the retention characteristics of the DRAM semiconductor devices of the comparison example.

FIG. 8 is a graph showing the result of refresh characteristics measurement of DRAM semiconductor devices having active regions shown in FIGS. 6 and 7A. The abscissa represents the back-bias voltage $-V_{BB}$ in the unit of V, and the ordinate represents a retention time in an arbitrary unit. A curve r1 indicates the static retention characteristics, and a curve r2 indicates the active retention characteristics.

As seen from the graph shown in FIG. 8, as compared to the static retention characteristics r1, the active retention characteristics r2 are degraded greatly. Such degraded active retention characteristics indicate a change in the memory contents of a storage capacitor caused by a potential change of adjacent word lines.

Figure 9:
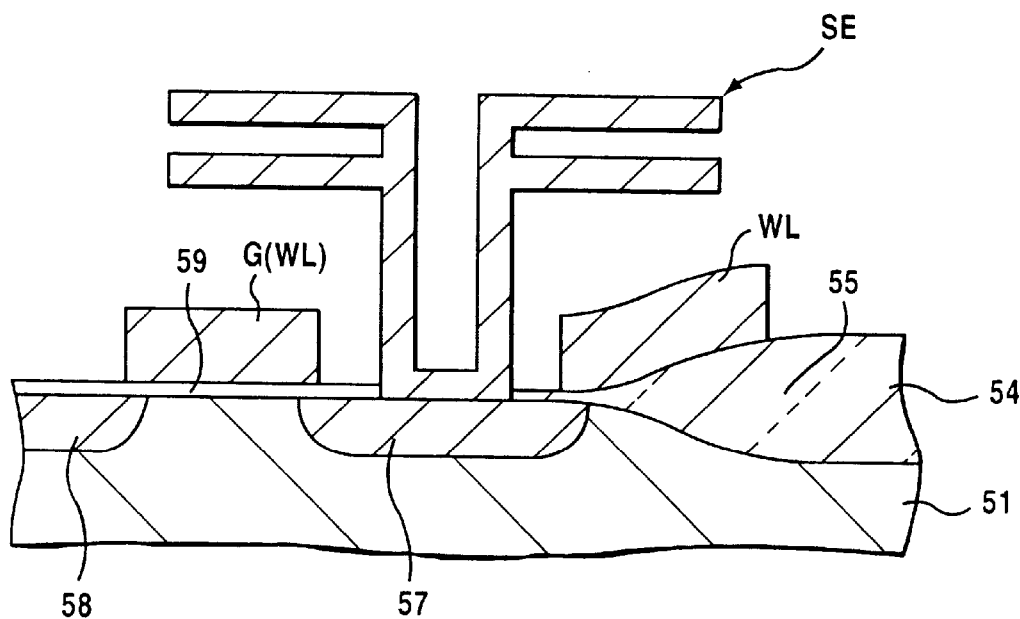
FIG. 9 is a cross sectional view of a comparison example used for the analysis thereof.

FIG. 9 schematically shows a cross sectional structure of the sample. On the surface of a p-type silicon substrate 51, a field oxide film 54 is formed and in the inner area thereof a bird's beak oxide film 55 grows. A word line WL lies also on the bird's beak oxide film 55. In an intrinsic active region, impurity doped source and drain regions 57 and 58 are formed. The storage electrode SE of a storage capacitor is connected to the source region 57. A gate electrode G is formed on a gate oxide film 59 formed over the surfaces of the source and drain regions 57 and 58, and extends to be contiguous to the word line WL. The semiconductor substrate 51 has a p-type conductivity and the source and drain regions 57 and 58 have an n-type conductivity.

It is to be noted here that a p-type silicon region 51 extends to lie under the word line WL through the bird's beak oxide film 55. As an on-signal of 6 V is applied to the word line WL, it is well conceivable that an inversion layer is formed in the surface region of the silicon substrate 51 under the thin bird's beak oxide film 55. As the inversion layer is formed, electrons accumulated on the storage electrode SE of the storage capacitor flow out into the inversion layer.

As the word line WL is turned off to 0 V thereafter, the inversion layer disappears. At this time, most of electrons flowed out into the inversion layer would return to the source region 57. However, some electrons would be trapped by centers formed at the interface between the bird's beak oxide film 55 and the p-type silicon substrate 51, and would be annihilated by holes in the p-type silicon substrate 51.

Therefore, the amount of information stored in the storage electrode SE will reduce. A reduction of electrons means a potential rise of the storage electrode SE so that the written information "0" may change to information "1". This is a so-called charge pumping mechanism.

If "1" is stored in the storage electrode SE at 4 V, the source region 57 is maintained at a potential of 4 V. The p-type silicon substrate 51 is applied with a back-bias voltage, typically -1 V. In this case, when an on-signal of 6 V is applied to the word line WL, the surface layer of the p-type silicon substrate 51 is depleted even if it does not form an inversion layer.

In this state, if electrons are emitted from centers formed at the interface between the bird's beak oxide film 55 and the silicon substrate 51, these electrons are accelerated by an electric field in the depletion layer and may reach the source region 57 applied with the voltage of +4 V. These electrons function to reduce the amount of information stored in the storage electrode SE and change the information "1" to "0". This is a so-called gate control diode leak.

As above, when an inversion layer or depletion layer is formed in the surface layer of the semiconductor substrate by the operations of the adjacent word line WL, information stored in the storage electrode will be destructed.

If the above-described assumption is correct, destruction of the cell information "0" depends on a repetition frequency of on/off signals applied to the word line. Destruction of the cell information "1" depends not on the frequency but on the total time while the word line is turned on.

The present inventors measured the number of memory cells whose stored information was destructed, by changing the repetition frequency of on/off signals applied to the word line WL during a predetermined period of 300 msec. The experiment results showed that the number of memory cells whose "0" information was destructed was in linear proportion to the repetition frequency of on/off signals applied to the word line WL during the predetermined period, and that destruction of "1" information is in proportion to the total time.

The above-described assumption is therefore highly acceptable. In order to prevent such destruction of stored information, it is desired not to form a word line on a thin bird's beak oxide film. However, if the active region is elongated in order to reserve a sufficient contact area of a storage electrode, the word line WL is forced to be formed on the bird's beak oxide film.

The present inventors considered to reduce the width of a bird's beak oxide film in order to solve the above problem.

Figure 10:
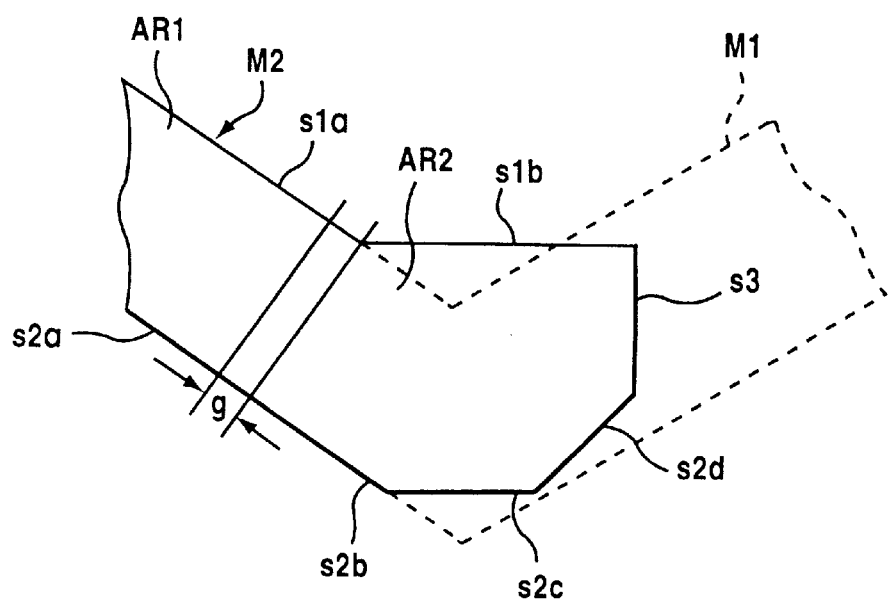
FIG. 10 is a plan view showing the shape of an active region which constitutes the basis of the present invention.

FIG. 10 shows an example of the shape of an oxidation-resistant mask devised for the width reduction. A mask M2 indicated by a solid line has a distal end area AR2 having a width greater than, and being continuous with, a linear strip area AR1 having a constant width. For comparison, the shape of a mask M1 is also shown which is modified from the above-described proposal by one of the inventors.

More specifically, the stripe area AR1 is defined by upper and lower sides s1a and s2a, and has a constant width. This upper side s1a is continuous with an upper side s1b of the distal end area AR2 which side s1b is bent relative to the side s1a and is parallel to the bit line direction.

A lower side s2b of the distal end area lies on a line extended from the lower side s2a of the stripe area, having the same direction as that of the lower side s2a. This lower side s2b is continuous with a lower side s2c which is parallel to the bit line, and is continuous with an oblique side s2d which shortens the distance to the upper side s1b. Both the upper and lower sides s1b and s2d terminate at a vertical side s3 which is disposed in parallel to the word line.

The pattern width of the distal end area defined between the upper and lower sides s1b and s2c is greater than the width of the stripe area defined between the upper and lower sides s1a and s2a.

The mask for defining an active region has therefore the distal end area AR2 being continuous with the stripe area having a constant width, and having a width greater than that of the stripe area. Since the distal end area AR2 has an expanded size in the width direction perpendicular to the pattern extension direction, it is expected that this area enhances the function of preventing crawling of the bird's beak.

Figure 11:
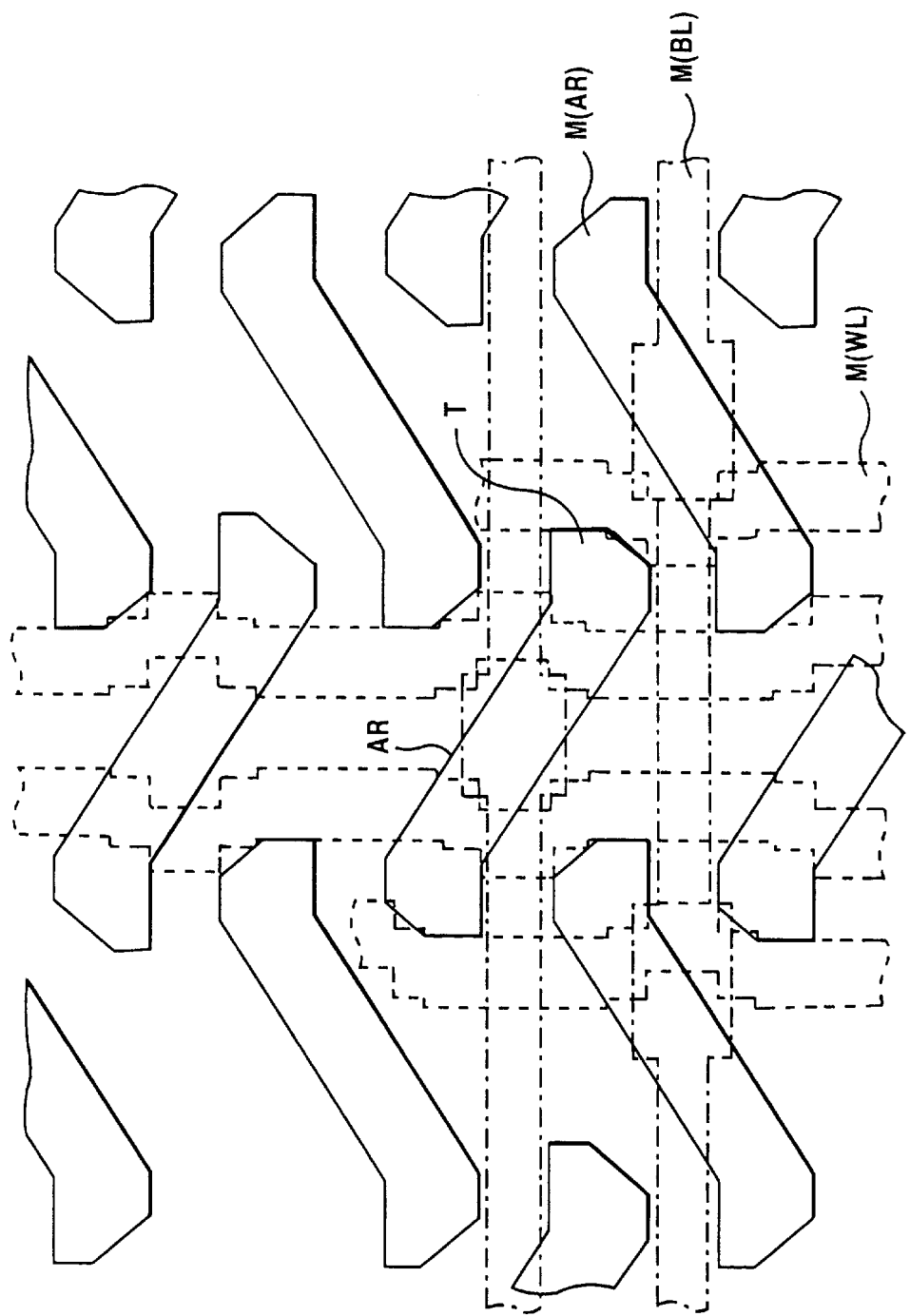
FIG. 11 is a plan view showing the layout of a DRAM semiconductor device according to an embodiment of the invention.

FIG. 11 is a plan view showing a mask pattern of a DRAM semiconductor device in the case of using the oxidation-resistant mask shown in FIG. 10. M(AR) represents the shape of an oxidation-resistant mask for use in a LOCOS process. M(WL) represents the shape of a word line pattern mask for use in a word line forming process. M(BL) represents the shape of a mask pattern for use in a bit line forming process. Although the word and bit line patterns are shown only partly, these patterns are repetitively disposed.

The bit line mask M(BL) extends in the horizontal direction in FIG. 11. The word line mask M(WL) extends as a whole in the direction perpendicular to the bit line BL, and in an area where the active region AR exists, it has such a bent portion that it crosses the stripe area of the active region AR substantially perpendicularly.

The word line mask M(WL) shown in FIG. 11 has a zig-zag shape. The corners of such a zig-zag shape in a pattern obtained after an exposure process of photoresist using this mask are rounded, and a smooth and continuous photoresist pattern is formed.

The characteristic points of the layout shown in FIGS. 10 and 11 are that the active region AR has a stripe area AR1 having a constant width and extending obliquely relative to the bit line and a distal end area AR2 continuous with the stripe area AR1 and having a wider size.

Figure 12:
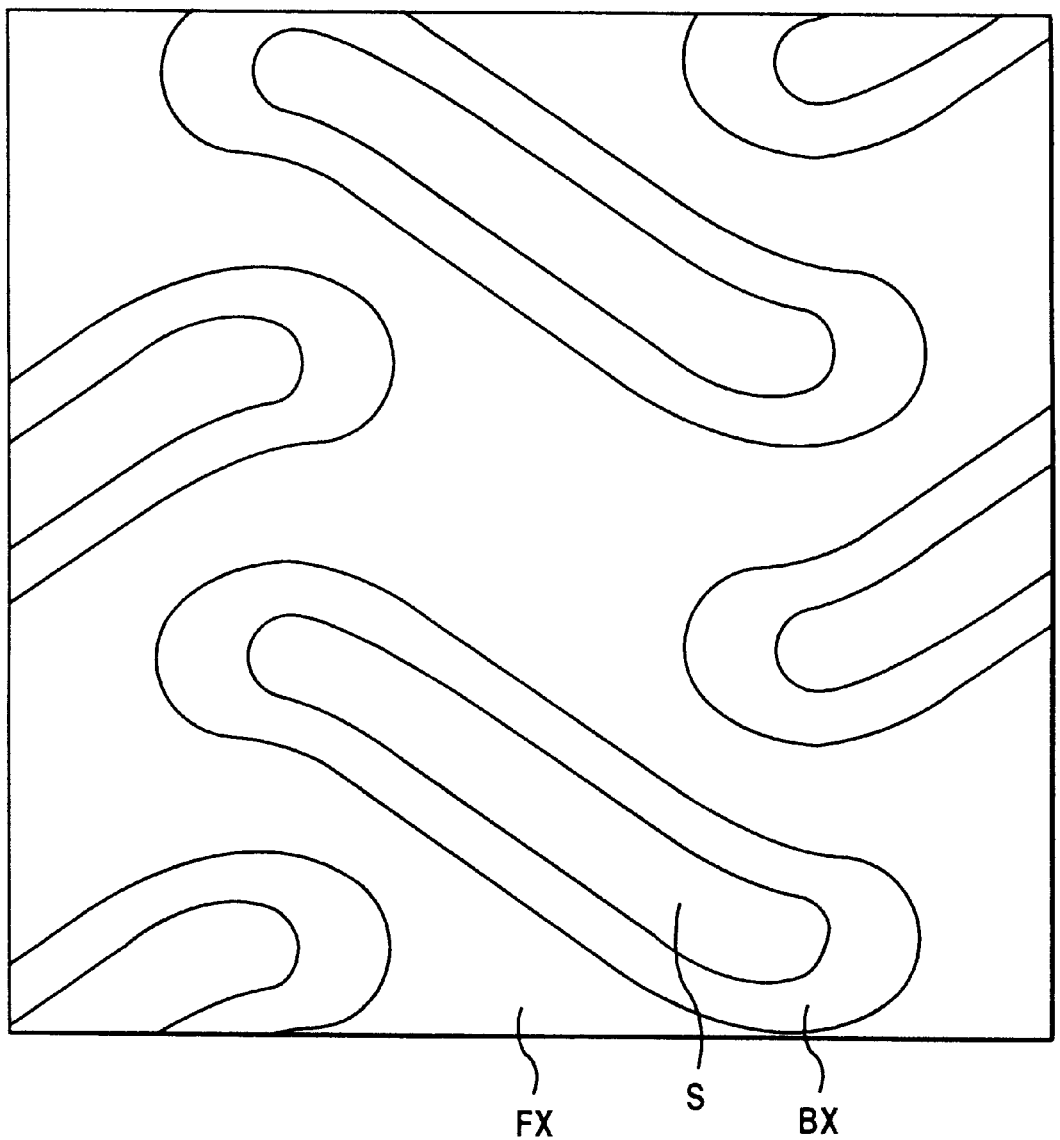
FIG. 12 is a sketch of a microscopic photograph of a sample having active regions according to the layout shown in FIG. 11.

FIG. 12 is a sketch of a microscopic photograph showing active regions formed by using the mask shown in FIG. 11. Similar to FIG. 7A, a symbol FX represents a field oxide film area, a symbol BX represents a bird's beak oxide film area, and a symbol S represents an exposed silicon surface.

In this structure, the width of the bird's beak oxide film BX crawling from opposite ends of each elongated active region is about 0.13 $\mu$m which is about twice or smaller than the width of about 0.08 $\mu$m of the bird's beak BX at the linear stripe area.

In the structure shown in FIG. 7A, the width of the bird's beak at opposite ends of each elongated active region is about 0.47 $\mu$m which is about six times as great as the width of about 0.08 $\mu$m of the bird's beak at the stripe area. In contrast, in the pattern shown in FIG. 12, a ratio of the bird's beak width at the opposite end areas of the active region to that at the stripe area is about 1.63, which shows a considerable reduction of the bird's beak width at the opposite end areas of the active region.

The bird's beak width at the opposite end areas of the active region is preferably three times or smaller than that at a stopper area, and more preferably twice or smaller.

A boundary between the field oxide film FX and the bird's beak oxide film BX shown in FIG. 12 can be considered as approximately corresponding to the shape of the oxidation-resistant mask. Upon consideration of the shape of this oxidation-resistant mask, the following points can be found.

In the central area of the active region, the stripe area having the nearly constant width is formed obliquely (about 30 degrees) relative to the bit line. At opposite ends of this stripe area, distal end areas are formed having a width greater than that of the stripe area. Consider an axis parallel to the bit line. The outer side of each distal end area is positioned generally along a line extended from each side of the stripe area, whereas the inner side of each distal end area is positioned so as to reduce the angle between the bit line and a corresponding side of the stripe area. The angle between this inner side and the bit line reduces by a half or larger of the angle (about 30 degrees) between the bit line and both the sides of the stripe area.

The angle between the bit line and the inner side of each distal end area is desirably reduced by at least 5 degrees from the angle between the bit line and the stripe area, preferably 10 degrees, and more preferably 15 degrees. The range of the angle of the inner side of each distal end area is preferably from 0 to 25 degrees, more preferably from 0 to 20 degrees, and most preferably from 0 to 15 degrees. The outer side at each distal end area of the active region of this layout is positioned along a line extended from each side of the stripe area. It will be apparent that the outer side may be expanded further outward to form some angle relative to the outer side of the stripe area.

Figure 13:
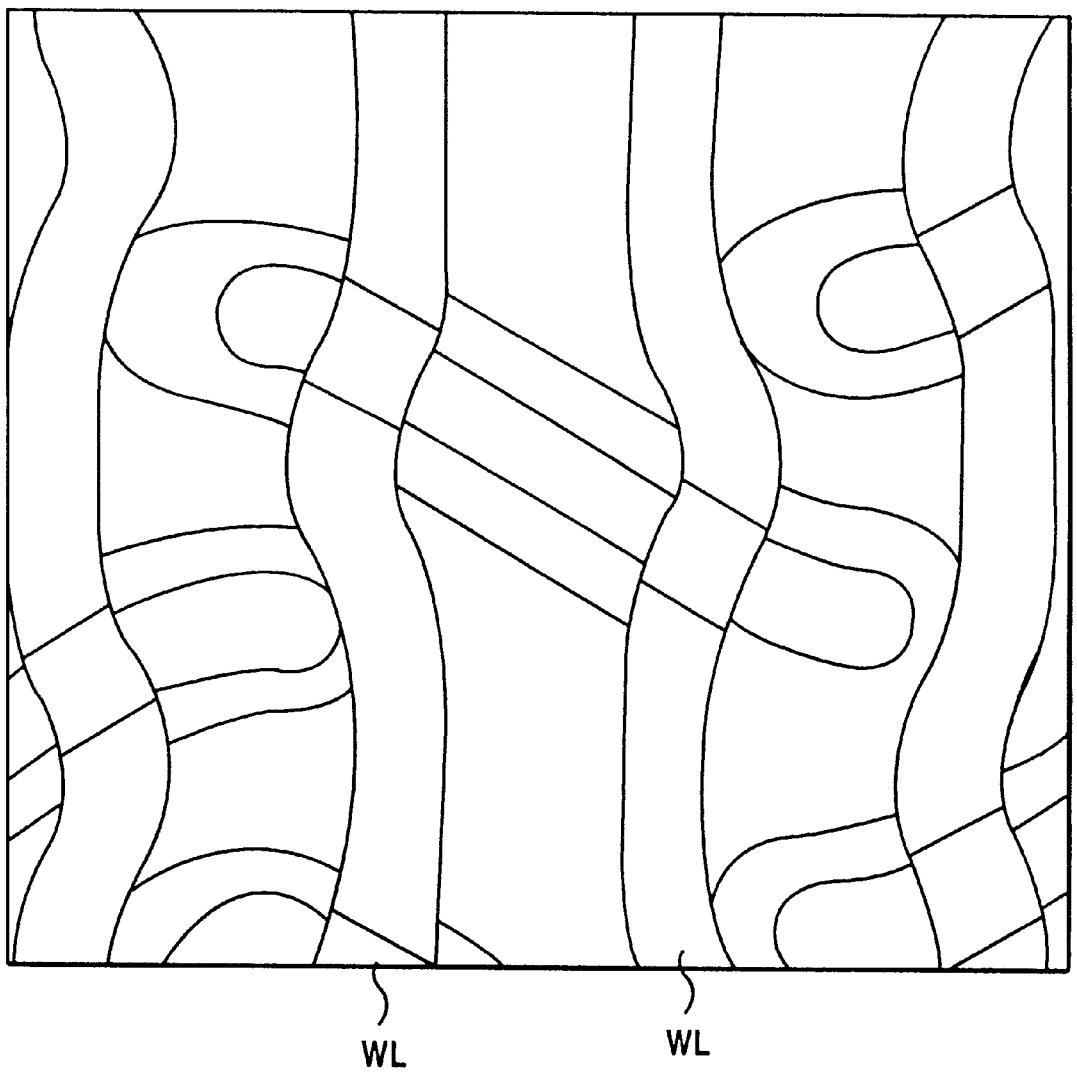
FIG. 13 is a sketch of a microscopic photograph of a sample in which word lines are formed in addition to the structure shown in FIG. 12.

FIG. 13 is a sketch of a microscopic photograph showing the pattern of a DRAM semiconductor device manufactured by forming active regions as shown in FIG. 12, forming a gate oxide film on the surface thereof, forming a lamination of a polysilicon layer and a metal silicide layer on the gate oxide film, and by patterning the lamination to form word lines (inclusive of gate electrodes). Patterns extending as a whole in the vertical direction are word lines, and patterns obliquely disposed under the word lines are active region patterns. The average pitch of word lines is about 0.75 μm.

It is to be noted that each word line WL intersects substantially at a right angle with the stripe area of the corresponding active region AR. In this specification, "substantially at a right angle" means maintaining substantially the same shape of an intersected area even if there is a mask alignment error. Since the word line WL and the stripe area of the active region are at a right angle, it can be understood that the channel region formed does not substantially change even if there is any alignment error between the word line mask pattern and active region mask pattern.

Figure 1:
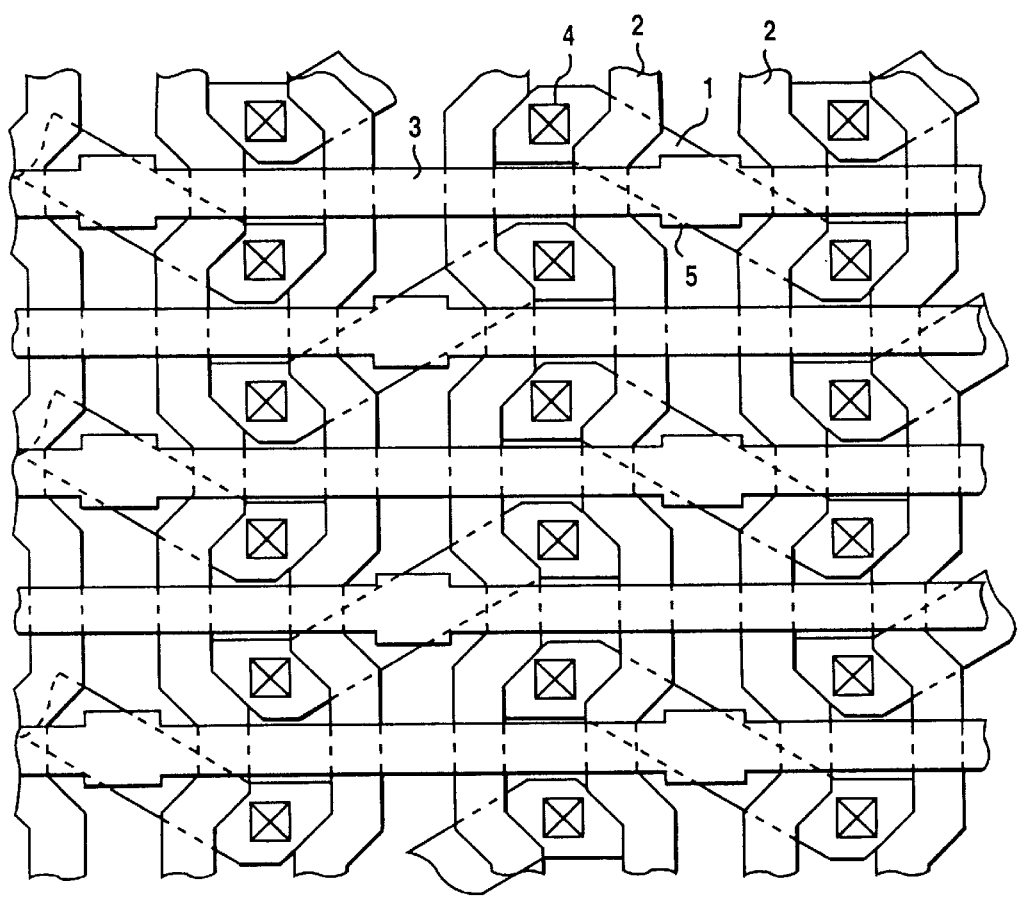
FIG. 1 is a plan view showing a layout of a DRAM semiconductor device according to an embodiment of the invention.

FIG. 1 is a plan view of the layout of a DRAM semiconductor device according to an embodiment of the invention which Is based upon the above-described preliminary experiments.

In FIG. 1, an area 1 disposed obliquely is a pattern of a silicon nitride film used for forming a field oxide film (this pattern defines an active region, and an intrinsic active region is formed in an area reduced by an amount corresponding to crawling of a bird's beak). A central linear stripe area thereof is formed obliquely relative to a bit line 3.

A word line 2 as a whole is disposed generally vertical to the bit line 3, and has a bent portion at an intersecting area with the active region so that it is disposed substantially a right angle to the stripe area of the active region. Since the intersecting area of the active region with the word line is disposed in the stripe area of the active region, the shape of a relative superposition area does not change even if there is an alignment error. Therefore, even if there is an alignment error, stable threshold value characteristics are ensured.

Distal end areas continuous with opposite ends of the stripe area are formed changing their directions so as to reduce the angle relative to the bit line. In other words, each distal end area is located in an area defined by adjacent two bit lines and two word lines, and has generally a square shape.

Since the stripe area and word line are required to be disposed substantially at a right angle, the word line has the bent portion. In this area where the word line has the bent portion, the corners the opposite end area of the active region are rounded so as not to overlap the word line.

In the area where the end area and the stripe area become in contact with each other, the outwardly projecting corner is rounded during photolithography and a bird's beak also crawls during LOCOS. Therefore, a rectangular corner is riot so much meaningful and hence the corner may be rounded appropriately. In the layout shown in FIG. 1, the outer side of the distal end area is positioned along a line extended from the oblique side of the stripe area. Namely, the shape shown in FIG. 1 has two corners adjacent to an adjacent bit line cut away.

The pattern of the silicon nitride film 1 as the oxidation-resistant mask shown in FIG. 1 is a pattern on a mask, and the corners of this pattern are rounded through exposure. The bird's beak oxide film crawls from the end of the silicon nitride film pattern toward the inside of the active region. Therefore, the intrinsic active region is formed inside of the crawled bird's beak oxide film. Since a quasi-active region under the bird's beak is disposed not to overlap the adjacent word line, a change in the word line potential affects little the quasi-active region.

The stripe area of the active region is linearly disposed along a line passing through two opposite capacitor contact holes, and has an angle of about 30 degrees relative to the bit line. The bent portion of the word line WL has an angle of about 30 degrees relative to the overall extension direction of the word line, at the area where the bent portion intersects with the stripe area, so that the bent portion intersects substantially at a right angle with the stripe area. A capacitor storage electrode C is formed in an area between adjacent bit lines, covering the adjacent word line. In the nearly central area of the storage electrode C, a contact hole 4 for the storage electrode is formed.

The features of the active region shown in FIG. 1 reside from another view point in that it is formed obliquely (at about 30 degrees) relative to the bit line and has a stripe area substantially at a right angle relative to the word line and an area parallel to the bit line formed between two adjacent bit lines and surrounding the storage electrode contact hole, and in that it does not extend under the non-associated adjacent word line (by which the circuit operation of the active region is not controlled).

With the above structure, variation of performance characteristics of memory cell transistors can be suppressed more and the influence of the adjacent word line can be reduced.

Next, the manufacture processes will be described with reference to the cross section taken along line X—X in FIG. 1 by way of example. FIGS. 2A to 2D and FIGS.3E to 3G show cross; sections of a semiconductor substrate.

Figure 2A:
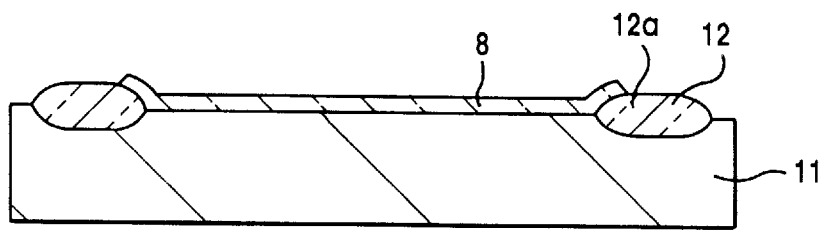
FIG. 2A to 2D are cross sectional views illustrating manufacture processes of the DRAM semiconductor device shown in FIG. 1.

Referring to FIG. 2A, the surface of a p-type silicon (p-Si) substrate 11 is thermally oxidized to form a silicon oxide film of about 5 nm thickness. On this silicon oxide film, a silicon nitride film is grown about 110 nm thick through chemical vapor deposition (CVD). By using photolithography, the silicon nitride film is patterned to form an oxidation-resistant mask 6.

By using this silicon nitride film as a mask, the surface of the silicon substrate 11 is oxidized with dry oxygen at 1100° C. or in a wet oxidizing atmosphere to form a field oxide film 12 of about 350 nm thickness. Because of oxygen or the like invading from the edge of the oxidation-resistant mask 8, an oxidized area is formed also under the edge portion of the oxidation-resistant mask 8 so that a bird's beak 12a is formed. The width of the bird's beak 12a is about 0.08 μm in the stripe area of the active region, and about 0.13 μm in the opposite end areas of the active region in its longitudinal direction. As compared to the bird's beak width of about 0.47 μm of the comparison example shown in FIG. 7A, the bird's beak width of this example in the opposite end areas of the active region is reduced to about ⅓.₅ or smaller. Although the bird's beak width depends on the process conditions, it is conceivable that the width can be reduced to ⅓ or smaller, more easily than the comparison example. It is preferable to set the bird's beak width to a half or smaller of the bird's beak width of the comparison example.

Although the bird's beak width of 0.13 μm in the opposite end areas of the active region is greater than that of 0.08 μm in the stripe area, the former is smaller than twice that of the latter. It is preferable to set the bird's beak width in the opposite end areas of the active region smaller than three times that in the stripe area, and more preferably smaller than twice. The intrinsic active region is formed in the area surrounded by the bird's beak 12a.

After the field oxide film is formed, an HF process is lightly performed in order to remove an oxide film formed on the surface of the oxidation-resistant mask 8 made of a silicon nitride film. Thereafter, the oxidation-resistant mask 8 of a silicon nitride film and the underlying buffer oxide film are removed. Then, the silicon substrate is exposed in dry oxygen at 900° C. or in an HCl oxidizing atmosphere to form an oxide film of about 10 nm thickness on the exposed silicon surface. After this oxide film is removed by an HF process, a gate oxide film 9 of about 10 nm thickness is formed through thermal oxidation.

Figure 2B:
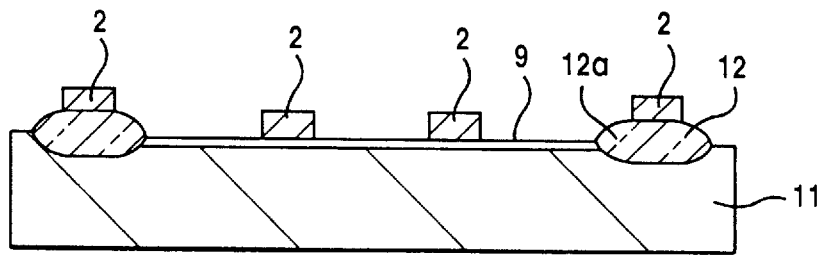

Referring to FIG. 2B, a polysilicon film is deposited on the whole surface of the substrate by CVD, and patterned by photolithography to form word lines (also serving as gate electrodes) 2. The word line 2 on the field oxide film 12 does not overlap the intrinsic active region under the gate oxide film 9, and has substantially no overlap with the bird's beak 12a (and its underlying quasi-active region).

Since the bird's beak oxide film 12a gradually reduces its thickness starting from the side of the field oxide film 12, influence of a slight overlap of the word line 2 with the bird's beak oxide film is small. The phrase "substantially no overlap" means no electrical influence of the word line 2 upon the silicon surface under the bird's beak oxide film 12a. In the following, the gate oxide film 9 is not shown in the drawings for simplicity purpose.

Figure 2C:
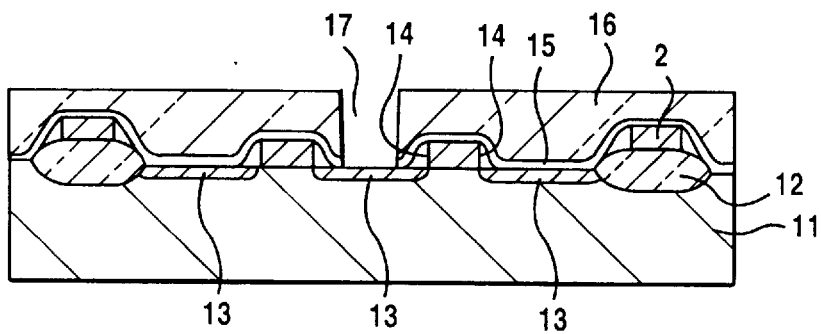

Referring to FIG. 2C, by using as a mask the word line 2, field oxide film 12 and bird's beak oxide film 12a, phosphorous ions are implanted at an acceleration energy of 30 keV and a dose of $2 \times 10^{13}$ cm$^{-2}$ to form source/drain regions 13. This impurity doping forms a lightly doped area of an LDD structure in a peripheral circuit.

An insulating film of silicon oxide or the like is deposited and anisotropic etching is performed to form side wall insulating films 14. This side wall insulating film is used as a mask for implanting impurity ions and forming a heavily doped area of an LDD structure in the peripheral circuit. A high temperature silicon oxide (HTO) film 15 and a BPSG film 16 are formed by CVD on the substrate formed with the side wall insulating films 14. The surface of the BPSG film 16 is planarized by a reflow process or a polishing process.

An opening 17 is formed through the BPSG film 16 and silicon oxide film 15 by photolithography to form a contact hole for the connection of a bit line to the central source/drain region 13.

Figure 2D:
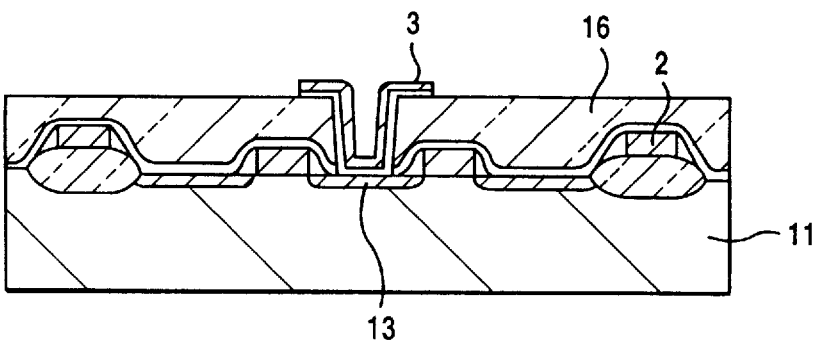

Referring to FIG. 2D, a polysilicon film and a tungsten silicide film are sequentially formed and patterned to form a bit line 3 connected to the source/drain region 13 in the contact hole 17.

Figure 3E:
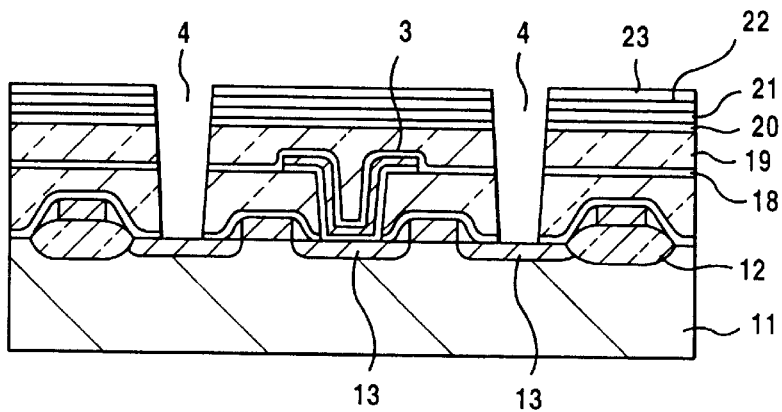
FIG. 3E to 3G are cross sectional views illustrating manufacture processes of the DRAM semiconductor device shown in FIG. 1.

Referring to FIG. 3E, a high temperature silicon oxide (HTO) film 18 and a BPSG film 19 are formed on the substrate surface by CVD, and the surface of the BPSG film 19 is planarized by a process similar to the above. A silicon nitride film 20, a silicon oxide film 21, a polysilicon film 22 and a silicon oxide film 23 are then formed on the substrate surface by CVD. Contact holes 4 reaching the source/drain regions 13 on both sides of the source/drain region 13 connected to the bit line 3 are formed by photolithography.

Figure 3F:
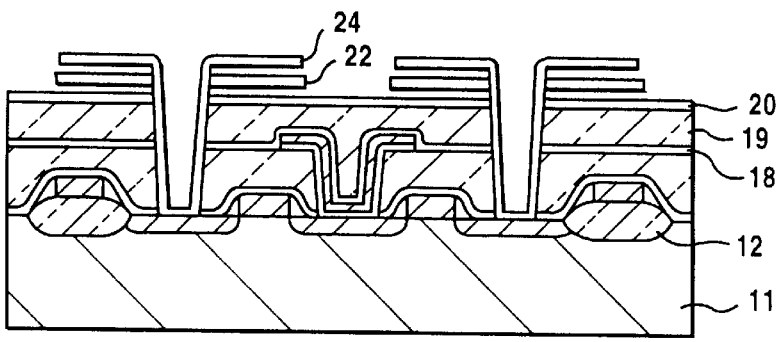

Referring to FIG. 3F, a polysilicon film 24 is formed, to cover the inside of the contact holes. Next, the polysilicon film 24, silicon oxide film 23 and polysilicon film 22 are patterned by photolithography to form a storage electrode structure. The silicon oxide films 23 and 21 are isotropically etched with HF solution to expose a fin structure of the polysilicon films 24 and 22.

Figure 3G:
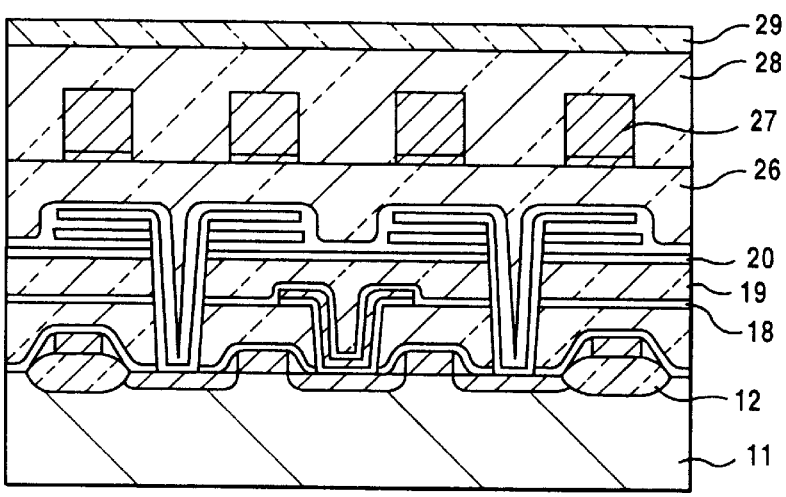

Referring to FIG. 3G, a dielectric film is formed on the surface of the polysilicon films 22 and 24, and an opposing electrode 25 made of polysilicon or the like is formed by CVD. With this process, the spaces in the fin structure are filled with the opposing electrode 25. A BPSG film 26 is formed covering the opposing electrode 25 and the surface of the BPSG film is planarized. The BPSG film 26, and according to necessity, the underlying lamination are etched to form metal wiring contact holes. Thereafter, a metal wiring 27 is formed and covered with an interlayer insulating film 28. The surface of the interlayer insulating film 28 is further covered with a cover insulating film 29. The metal wiring 27 is made of a buffer metal layer and a main metal wiring layer. The metal wiring 27 may also be a lamination of three or more layers.

FIG. 4 is a graph showing the retention characteristics of memory cells formed in the above manner. The abscissa represents a substrate back-bias $-V_{BB}$ in the unit of V and the ordinate represents a retention time in an arbitrary unit. As shown, static characteristics r1 with the adjacent word line maintained off and active retention characteristics r2 with the adjacent word line repetitively applied with on/off signals overlap on the same curve. The measurement conditions are the same as described with FIG. 8.

As compared to FIG. 8, it can be understood that the active retention characteristics are improved considerably. This improvement in the active retention characteristics indicates a reduction of leak current from the storage electrode. The leak current reduction may be ascribed to the reduction of a crawled width of the bird's beak oxide film, substantially no overlap of adjacent word line on the bird's beak, and formation of the word lines only on a sufficiently thick field oxide film.

The present invention has been described in connection with the preferred embodiments. The invention is not limited only to the above embodiments. It will be apparent to those skilled in the art that various modifications, improvements, combinations, and the like can be made.

What is claimed is:

1. A DRAM semiconductor device comprising:

a semiconductor substrate;

a field insulating film formed on said semiconductor substrate;

a plurality of active regions, each surrounded by said field insulating film and formed said semiconductor substrate;

a gate electrode traversing each of said plurality of active regions;

a pair of source/drain regions formed in each of said plurality of active regions on both sides of said gate electrode;

a plurality of bit lines disposed along one direction each connected to one region of said pair of source/drain regions;

a plurality of word lines disposed along a direction perpendicular to said bit lines, each of said plurality of word lines being connected to said gate electrode; and a plurality of capacitor elements disposed over said gate electrode each connected to the other region of said pair of source/drain regions, wherein each of said plurality of active regions includes an oblique area, formed obliquely relative to said bit and word lines, and a parallel area formed in parallel to said bit line and having a width greater than the width of the oblique area, said word lines have a bent portion intersecting substantially at a right angle with the oblique area of every other one of said active regions, and said word lines extend outside of said active regions adjacent to said every other one of said active regions without overlapping.

2. A DRAM semiconductor device according to claim 1, wherein the oblique area of each said active region intersects with said bit line at an angle of about 30 degrees.

3. A DRAM semiconductor device comprising:

a semiconductor substrate;

a plurality of parallel bit lines disposed over said semiconductor substrate and linearly extending along one direction;

a plurality of active regions formed on the surface of said semiconductor substrate, said active region including a linear stripe area whose central area intersects with said bit line at a first angle and opposite end areas each having a width greater than the width of the stripe area and having a second angle relative to said bit line, the second angle being smaller than the first angle;

a field insulating film formed on said semiconductor substrate and having openings which define said plurality of active regions;

a plurality of bird's beak insulating films each formed continuously with said field insulating film along an inner circumference of the opening of said field insulating film and defining an intrinsic active region at the inner area of said bird's beak insulating film and defining a quasi-active region under said bird's beak insulating film;

a plurality of word lines formed over said semiconductor substrate and intersecting as a whole substantially at a right angle with said bit lines, two of the word lines being associated with each said active region, and each of said plurality of word lines having a bent portion intersecting substantially at a right angle with the stripe area over an associated one of said active regions and having substantially no overlap with a non-associated one of said active regions;

one drain and a pair of sources formed in each of the intrinsic active regions, said one drain being formed between associated two of the word lines and connected to an associated one of said bit lines, and said pair of sources being formed outside of the associated two of the word lines; and a storage capacitor connected to each of said sources.

4. A DRAM semiconductor device according to claim 3, wherein said bird's beak insulating film has a width at the opposite end areas of said active region, three times or smaller than a width at the stripe area.

5. A DRAM semiconductor device according to claim 3, wherein said bird's beak insulating film has a width at the opposite end areas of said active region, twice or smaller than a width at the stripe area.

6. A DRAM semiconductor device according to claim 3, wherein each of the opposite end areas of said active region has a first side and a second side, the first side being positioned along a line extended from the side of the stripe area, and the second side facing the first side and having a third angle relative to said bit line, the third angle being smaller than the first angle.

7. A DRAM semiconductor device according to claim 6, wherein the first angle is about 30 degrees and the third angle is in the range from 0 degree to 25 degrees.

8. A DRAM semiconductor device according to claim 6, wherein the first angle is about 30 degrees and the third angle is in the range from 0 degree to 20 degrees.

9. A DRAM semiconductor device according to claim 6, wherein the first angle is about 30 degrees and the third angle is in the range from 0 degree to 15 degrees.

10. A DRAM semiconductor device according to claim 3, wherein the opposite end areas of said active region are separated from the associated two word lines along a substrate surface direction.

11. A DRAM semiconductor device according to claim 3, wherein said field insulating film is thinner than a maximum thickness of said bird's beak insulating film.

12. A DRAM semiconductor device comprising:

a semiconductor substrate;

a plurality of parallel bit lines disposed over said semiconductor substrate and linearly extending along one direction;

a plurality of active regions formed on the surface of said semiconductor substrate, each of said active regions including a linear stripe area whose central area intersects with said bit line at a first angle and opposite end areas continuous with the opposite ends of the stripe area in a longitudinal direction thereof, each forming a second angle relative to said bit line, the second angle being smaller than the first angle;

a field insulating film formed on said semiconductor substrate and having openings which define said plurality of active regions;

a bird's beak insulating film formed on the surface of said active region of said semiconductor substrate along an inner circumference of the opening of said field insulating film and defining an intrinsic active region at the inner area of said bird's beak insulating film and defining a quasi-active region under said bird's beak insulating film, said bird's beak insulating film having a width at the opposite end area of said active region, twice or smaller than a width of the bird's beak insulating film at the stripe area;

a plurality of word lines formed over said semiconductor substrate and intersecting as a whole substantially at a right angle with said bit lines, two of the word lines being associated with each said active region, and each of said plurality of word lines having a bent portion intersecting substantially at a right angle with the stripe area over an associated one of said active regions and having substantially no overlap with a non-associated one of said active regions;

one drain and a pair of sources formed in each of the intrinsic active regions, said one drain being formed between two associated word lines, and said pair of sources being formed outside of the two associated word lines; and a storage capacitor connected to each of said pair of sources.

13. A DRAM semiconductor device comprising:

a semiconductor substrate;

a plurality of parallel bit lines disposed over said semiconductor substrate and linearly extending along one direction;

a plurality of active regions formed on the surface of said semiconductor substrate, each of said active regions including a linear stripe area whose central area intersects with said bit line at a first angle and opposite end areas continuous with the opposite ends of the stripe area in the longitudinal direction, each having a width greater than a width of the stripe area;

a field insulating film formed on said semiconductor substrate and having openings which define said plurality of active regions;

a bird's beak insulating film formed on the surface of said active region of said semiconductor substrate along an inner circumference of the opening of said field insulating film and defining an intrinsic active region at an inner area of said bird's beak insulating film and defining a quasi-active region under said bird's beak insulating film;

a plurality of word lines formed over said semiconductor substrate and intersecting as a whole substantially at a right angle with said bit lines, two of the word lines being associated with each said active region, and each of said plurality of word lines having a bent portion intersecting substantially at a right angle with the stripe area over an associated one of said active region and having substantially no overlap with a non-associated one of said active regions;

one drain and a pair of sources formed in each of the intrinsic active regions, said one drain being formed between two associated word lines, and said pair of sources being formed outside of the two associated word lines; and a storage capacitor connected to each of said sources.

14. A DRAM semiconductor device according to claim 13, wherein said bird's beak insulating film has a width at the opposite end area of said active region, three times or smaller than a width at the stripe area.

15. A DRAM semiconductor device according to claim 13, wherein said bird's beak insulating film has a width at the opposite end area of said active region, twice or smaller than a width at the stripe area.

16. A DRAM semiconductor device according to claim 13, wherein each of the opposite end areas of said active region has a first side and a second side, the first side being positioned along a line extended from the side of the stripe area, and the second side facing the first side and having a second angle relative to said bit line, the second angle being smaller than the first angle.

17. A DRAM semiconductor device according to claim 16, wherein the first angle is about 30 degrees and the second angle is in the range from 0 degree to 25 degrees.

18. A DRAM semiconductor device according to claim 16, wherein the first angle is about 30 degrees and the second angle is in the range from 0 degree to 20 degrees.

19. A DRAM semiconductor device according to claim 16, wherein the first angle is about 30 degrees and the second angle is in the range from 0 degree to 15 degrees.

20. A DRAM semiconductor device according to claim 13, wherein the opposite end areas of said active region are separated from the associated two word lines along a substrate surface direction.

21. A DRAM semiconductor device according to claim 13, wherein said field insulating film is thinner than a maximum thickness of said bird's beak insulating film.

22. A DRAM semiconductor device comprising:
a first active region surrounded by field insulating film and formed in a semiconductor substrate;
a second active region adjacent to said first active region;
a gate electrode traversing said first active region;
a pair of source/drain regions formed in said first active region on opposite sides of said gate electrode;
a bit line extending along one direction connected to one region of said pair of source/drain regions;
a word line extending along a direction perpendicular to said bit line, said word line being connected to said gate electrode; and
a capacitor element disposed over said gate electrode, connecting to the other of said pair of source/drain regions, wherein said first active region includes an oblique area formed obliquely relative to said bit and word lines and a parallel area formed in parallel to said bit line and having a width greater than the width of the oblique area, said word line has a bent portion intersecting substantially at a right angle with the oblique area of said first active region and said word line extends outside said second active region without overlapping.

23. A DRAM semiconductor device comprising:
a plurality of word lines;
a plurality of bit lines intersecting the word lines; and
a plurality of memory cells, connected to the word lines and bit lines, each of the memory cells comprising a transistor formed in an active region in a semiconductor substrate and a capacitor connected to the transistor, wherein the active region includes an oblique area, obliquely extending completely across one of the bit lines, and bent areas at ends of the active region, each of the bent areas has a width greater than a width of the oblique area, each of said bent areas having a portion extending laterally without a decrease in the width, each of the bit lines is electrically connected to the oblique area, each of the word lines extends across the oblique area as a gate electrode of the transistor.

24. A DRAM semiconductor device according to claim 23, wherein the capacitor has a first electrode electrically connected to one of the bent areas of the active region, and a second electrode, the bit lines being composed of a layer disposed lower than the first electrode.

25. A DRAM semiconductor device according to claim 23, wherein the active region intersects the bit line at an angle of less than 45 degree.

26. A DRAM semiconductor device according to claim 23, wherein the bent areas of the active region extend substantially in parallel to the bit line.

27. A DRAM semiconductor device according to claim 23, wherein the bent areas extend at an angle which is in a range from 0 degree to 20 degree relative to a direction of the bit lines.

28. A DRAM semiconductor device comprising:
a semiconductor substrate;
a field insulating film formed on said semiconductor substrate;
a plurality of active regions, each surrounded by said field insulating film and formed in said semiconductor substrate;
a gate electrode traversing each of said plurality of active regions;
a pair of source regions formed in and at ends of each of said plurality of active regions;
a drain region formed in and at a central area of each of said plurality of active regions;
a plurality of bit lines disposed along one direction each connected to said drain region;
a plurality of word lines disposed along a direction crossing said bit lines, each of said plurality of word lines being connected to said gate electrode; and
a plurality of capacitor elements disposed over said gate electrode each connected to the source region, wherein each of said plurality of active regions includes an oblique area formed obliquely relative to said bit and word lines, and bent areas formed at ends of said oblique area and having a width greater than the width of the oblique area, said oblique area extending completely across one of the bit lines, said each of said bent areas having a portion extending laterally without a decrease in the width, said word lines have a portion intersecting with the oblique area.

29. A DRAM semiconductor device comprising:

a semiconductor substrate;

a field insulating film formed on said semiconductor substrate;

a plurality of active regions, each surrounded by said field insulating film and formed in said semiconductor substrate;

a gate electrode traversing each of said plurality of active regions;

a pair of source/drain regions formed in each of said plurality of active regions on both sides of said gate electrode;

a plurality of bit lines disposed along one direction each connected to one region of said pair of source/drain regions;

a plurality of word lines intersecting said bit lines, each of said plurality of word lines being connected to said gate electrode; and a plurality of capacitor elements disposed over said gate electrode each connected to the other region of said pair of source/drain regions, wherein each of said plurality of active regions includes an oblique area, formed obliquely relative to said bit and word lines, and a bent area having a width greater than the width of the oblique area, said bent area having a portion extending laterally without a decrease in the width, said word lines intersecting with the oblique area of every other one of said active regions, and said word lines extend outside of said active regions adjacent to said every other one of said active regions.

* * * * *